United States Patent
Kaga et al.

(10) Patent No.: US 12,140,639 B2
(45) Date of Patent: Nov. 12, 2024

(54) MEASUREMENT DEVICE, MEASUREMENT METHOD, AND STORAGE MEDIUM

(71) Applicant: HONDA MOTOR CO., LTD., Tokyo (JP)

(72) Inventors: Tadashi Kaga, Wako (JP); Yuki Tominaga, Wako (JP); Mao Hori, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 154 days.

(21) Appl. No.: 18/112,529

(22) Filed: Feb. 22, 2023

(65) Prior Publication Data

US 2023/0288486 A1 Sep. 14, 2023

(30) Foreign Application Priority Data

Mar. 11, 2022 (JP) ................................. 2022-038080

(51) Int. Cl.
   *G01R 31/3842* (2019.01)
   *H01M 10/42* (2006.01)
   *H02J 7/00* (2006.01)

(52) U.S. Cl.
   CPC .... *G01R 31/3842* (2019.01); *H01M 10/4285* (2013.01); *H02J 7/0047* (2013.01)

(58) Field of Classification Search
   None
   See application file for complete search history.

(56) References Cited

U.S. PATENT DOCUMENTS

2012/0208087 A1* 8/2012 Yamamoto ............ H01M 4/525
                                                                   429/223
2016/0239586 A1    8/2016 Ho

FOREIGN PATENT DOCUMENTS

| JP | 2015-230817 | 12/2015 |
| JP | 2018-084549 | 5/2018 |
| JP | 2020-109367 | 7/2020 |
| JP | 2021-163632 | 10/2021 |
| JP | 2022-026770 | 2/2022 |
| JP | 2022-030983 | 2/2022 |
| WO | 2015/029153 | 3/2015 |

OTHER PUBLICATIONS

Japanese Notice of Allowance for Japanese Patent Application No. 2022-038080 mailed Oct. 31, 2023.

* cited by examiner

*Primary Examiner* — Jas A Sanghera
(74) *Attorney, Agent, or Firm* — Amin, Turocy & Watson, LLP

(57) ABSTRACT

A measurement device of a negative electrode SEI formation amount of a lithium ion battery includes a charge/discharge controller configured to perform charge/discharge control of the lithium ion battery, a voltage measurement part configured to measure a discharge voltage of the lithium ion battery, a current measurement part configured to measure a discharge current of the lithium ion battery, a discharge time measurement part configured to measure a discharge time of the lithium ion battery, a storage configured to store measurement results of the voltage measurement part, the current measurement part and the discharge time measurement part, and a calculation part configured to calculate a negative electrode SEI formation amount of the lithium ion battery.

3 Claims, 3 Drawing Sheets

MEASUREMENT DEVICE, MEASUREMENT METHOD, AND STORAGE MEDIUM

CROSS-REFERENCE TO RELATED APPLICATION

Priority is claimed on Japanese Patent Application No. 2022-038080, filed Mar. 11, 2022, the content of which is incorporated herein by reference.

BACKGROUND OF THE INVENTION

Field of the Invention

The present invention relates to a measurement device, a measurement method, and a storage medium.

Description of Related Art

Lithium ion batteries are characterized by large capacity, small size and low weight, and are already widely used in mobile devices such as smartphones or book-size personal computers. In addition, in recent years, the range of use of these batteries has continued to expand, to include commercialization as batteries for hybrid automobiles and electric automobiles. For that purpose, while it is necessary to further improve the performance of lithium ion batteries, one of the keys to this performance is the solid electrolyte interphase (SEI) coating formed on an electrode electrolyte interface.

A lithium ion battery is constituted by a positive electrode containing lithium and a negative electrode that storages and adsorbs the lithium, and charging (or discharging) occurs as the lithium moves from the positive electrode to the negative electrode (or from the negative electrode to the positive electrode) via the electrolyte. A coating called an SEI coating is formed on a surface of the negative electrode by decomposing the electrolyte. The SEI coating contributes to improvement in performance such as suppressing further decomposition of the electrolyte or the like while playing a role in inserting and removing lithium ions into and out of the electrode. Meanwhile, since a decomposition reaction of the electrolyte may occur when the SEI coating is too thin, and the electrical resistance may be increased when the SEI coating is too thick, the SEI coating may have an adverse influence on the lifespan or the efficiency of lithium ion batteries. For this reason, measuring the formation amount of the negative electrode SEI coating is important for evaluating deterioration of lithium ion batteries.

In the related art, measurement of the formation of the negative electrode SEI coating has been performed by disassembly analysis of disassembling the lithium ion battery and measuring an Li amount in the negative electrode SEI coating on which inductively coupled plasma (ICP) emission spectrometry is performed, or by non-disassembly analysis of acquiring positive electrode/negative electrode Ah-OCP curves (electrical discharge-open circuit potential curves) using dV/dQ analysis and measuring a negative electrode SEI formation amount from a positional change of electric potential edges of the positive electrode and the negative electrode.

Japanese Unexamined Patent Application, First Publication No. 2020-109367 discloses a method related to estimation of an internal state of a secondary battery characterized in that a parameter estimation unit reads various initial values such as estimated capacities of a positive electrode and a negative electrode, an estimated battery charge capacity of the secondary battery, estimated initial charge capacities of the positive electrode and the negative electrode, and an initial value of a battery temperature from a parameter storage, and updates a positive electrode capacity deterioration factor, a negative electrode capacity deterioration factor, a negative electrode charge capacity deterioration factor, a first internal resistance deterioration factor, and/or a second internal resistance deterioration factor.

Japanese Unexamined Patent Application, First Publication No. 2015-230817 discloses a technique of detecting a decrease of lithium due to capacity deterioration or side reactions of a positive electrode and a negative electrode, and determining an SOC operation range in which deterioration of a single cell can be suppressed based on the detection results.

Japanese Unexamined Patent Application, First Publication No. 2018-084549 discloses a state estimation device of a secondary battery capable of accurately estimating a charging rate of a battery in consideration of an amount of deterioration products in a positive electrode or a negative electrode.

SUMMARY OF THE INVENTION

Incidentally, an increase in negative electrode SEI formation amount is known to be a main cause of deterioration of lithium ion batteries. When the negative electrode SEI formation amount is calculated from a positional change of the electric potential edges of the positive electrode and the negative electrode using dV/dQ analysis, a combination of both the negative electrode SEI formation amount and the negative electrode shrinkage factor is calculated, and thus, the negative electrode SEI formation amount cannot be acquired with good accuracy. So far, there is no method that considers the negative electrode shrinkage factor when the negative electrode SEI formation amount is measured.

An aspect of the present invention is directed to providing a measurement device, a measurement method, and a storage medium that are capable of measuring a negative electrode SEI formation amount of a lithium ion battery.

A measurement device, a measurement method, and a storage medium configured to measure a negative electrode SEI formation amount of a lithium ion battery according to the present invention employ the following configurations.

(1) A measurement device configured to measure a negative electrode SEI formation amount of a lithium ion battery according to an aspect of the present invention includes a charge/discharge controller configured to perform charge/discharge control of the lithium ion battery; a voltage measurement part configured to measure a discharge voltage of the lithium ion battery; a current measurement part configured to measure a discharge current of the lithium ion battery; a discharge time measurement part configured to measure a discharge time of the lithium ion battery; a storage configured to store measurement results of the voltage measurement part, the current measurement part and the discharge time measurement part; and a calculation part configured to calculate a negative electrode SEI formation amount of the lithium ion battery, the calculation part causing a computer to: acquire an initial positive electrode Ah-OCP curve and an initial negative electrode Ah-OCP curve by using a dV/dQ curve and charge/discharge curve fitting on the basis of results of the voltage measurement part, the current measurement part, and the discharge time measurement part read from the storage, calculate a shrinkage factor (%) from an initial value for each of the positive electrode and the negative electrode, calculate a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference, calculate a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting, calculate a deviation A of Ah between a fixed point of the negative electrode Ah-OCP curve to which only the shrinkage factor is applied and a fixed point of a post-deterioration negative electrode Ah-OCP curve calculated by a dV/dQ curve and charge/discharge curve fitting, and calculate a negative electrode SEI formation amount as A−Z (A minus Z).

(2) A measurement method for measuring a negative electrode SEI formation amount of a lithium ion battery according to an aspect of the present invention includes acquiring an initial positive electrode Ah-OCP curve and an initial negative electrode Ah-OCP curve by using a dV/dQ curve and charge/discharge curve fitting on the basis of results of a charge/discharge test of the lithium ion battery, calculating a shrinkage factor (%) from an initial value for each of the positive electrode and the negative electrode, calculating a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference, calculating a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting, calculating a deviation A of Ah between a fixed point of the negative electrode Ah-OCP curve to which only the shrinkage factor is applied and a fixed point of a post-deterioration negative electrode Ah-OCP curve calculated by a dV/dQ curve and charge/discharge curve fitting, and calculating a negative electrode SEI formation amount as A−Z (A minus Z).

(3) A computer-readable non-transient storage medium, on which a program for measuring a negative electrode SEI formation amount of a lithium ion battery is stored according to an aspect of the present invention, causes a computer to acquire an initial positive electrode Ah-OCP curve and an initial negative electrode Ah-OCP curve by using a dV/dQ curve and charge/discharge curve fitting on the basis of results of a charge/discharge test of the lithium ion battery, calculate a shrinkage factor (%) from an initial value for each of the positive electrode and the negative electrode, calculate a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference, calculate a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting, calculate a deviation A of Ah between a fixed point of the negative electrode Ah-OCP curve to which only the shrinkage factor is applied and a fixed point of a post-deterioration negative electrode Ah-OCP curve calculated by a dV/dQ curve and charge/discharge curve fitting, and calculate a negative electrode SEI formation amount as A−Z (A minus Z).

According to the aspects of the above-mentioned (1) to (3), the negative electrode SEI formation amount can be measured accurately in consideration of the negative electrode shrinkage factor. As a result, performance of the lithium ion battery can be evaluated more accurately, and improvement of energy efficiency and reduction in environmental load can be achieved.

In the aspects, it is possible to derive a deviation related to relative electric potential between the positive electrode and the negative electrode according to the SEI formation amount that is one of main causes of deterioration of a lithium ion battery extracted from results of electrochemical measurement without conducting disassembly analysis. For this reason, it is useful in that disassembly analysis is unnecessary and information of the entire cell can be acquired, and a electric potential deviation due to an SEI formation amount can be derived accurately.

DETAILED DESCRIPTION OF THE INVENTION

Hereinafter, embodiments of a measurement device, a measurement method, and a storage medium configured to measure a negative electrode SEI formation amount of a lithium ion battery of the present invention will be described with reference to the accompanying drawings.

<Configuration of Measurement Device>

Figure 1:
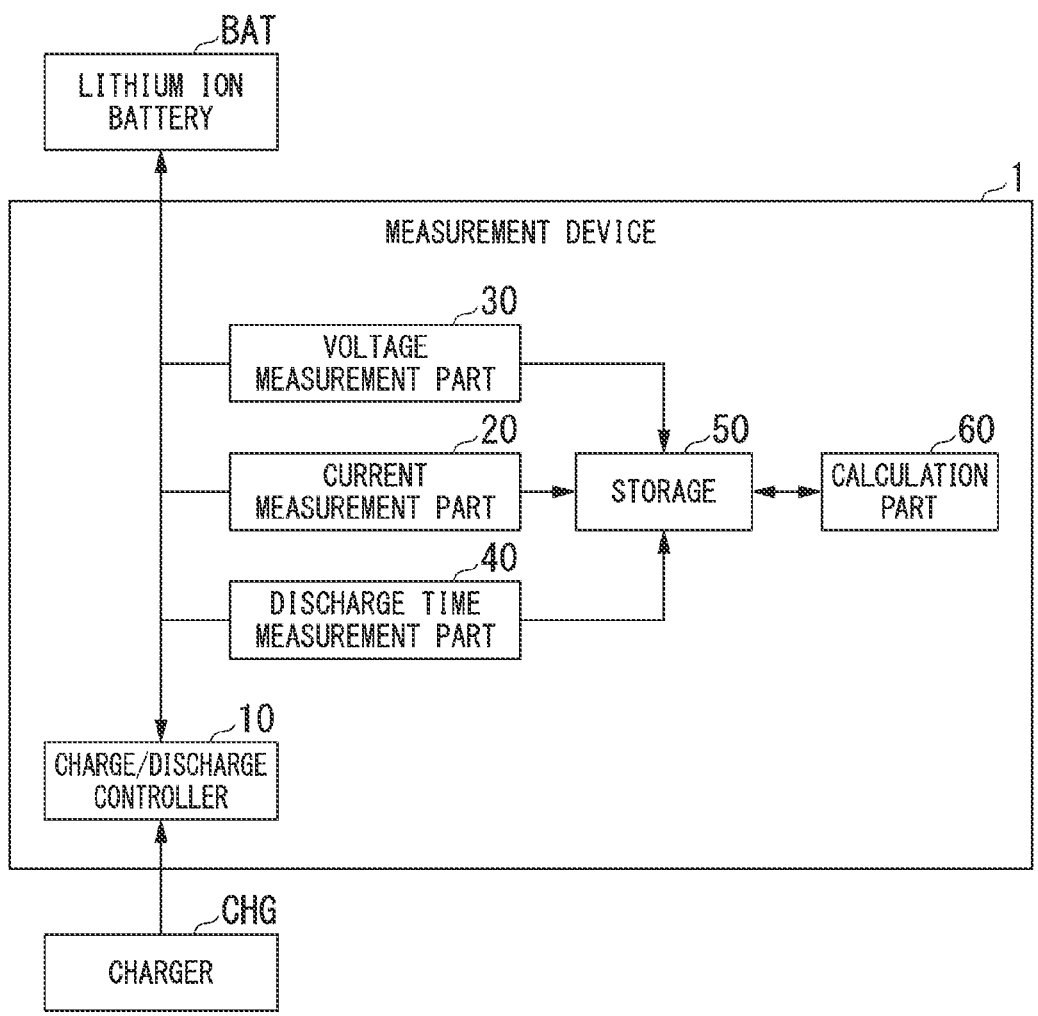
FIG. 1 is a block diagram showing a major configuration of a measurement device according to an embodiment of the present invention.

FIG. 1 is a block diagram showing a major configuration of a measurement device according to an embodiment of the present invention. As shown in FIG. 1, a measurement device 1 of the embodiment includes a charge/discharge controller 10, a current measurement part 20, a voltage measurement part 30, a discharge time measurement part 40, a storage 50, and a calculation part 60. Such a measurement device 1 charges a lithium ion battery BAT using electric power supplied from a charger CHG and performs a charge/discharge test.

The charger CHG supplies electric power required to charge the lithium ion battery BAT to the measurement device 1.

The charge/discharge controller 10 performs charge/discharge control of the lithium ion battery BAT.

The storage 50 stores measurement results of the current measurement part 20, the voltage measurement part 30, and the discharge time measurement part 40. In addition, the storage 50 also stores a calculation result of the calculation part 60.

The calculation part 60 calculates a negative electrode SEI formation amount of the lithium ion battery BAT using time-series data stored in the storage 50. More specifically, the calculation part 60 acquires an initial positive electrode Ah-OCP curve and an initial negative electrode Ah-OCP curve by a dV/dQ curve and charge/discharge curve fitting on the basis of the time-series data stored in the storage 50, calculates a shrinkage factor (%) from an initial value of each of the positive electrode and the negative electrode, calculates a positive electrode Ah-OCP curve and a negative electrode Ah-OCP curve to which only the shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference, calculates a deviation Z of Ah between the fixed point of the positive electrode Ah-OCP curve to which only the shrinkage factor is applied and the fixed point of the post-deterioration positive electrode Ah-OCP curve calculated by the dV/dQ curve and the charge/discharge curve fitting, calculates a deviation A of Ah between the fixed point of the negative electrode Ah-OCP curve to which only the shrinkage factor is applied and the fixed point of the post-deterioration negative electrode Ah-OCP curve calculated by the dV/dQ curve and the charge/discharge curve fitting, and thus, calculates a negative electrode SEI formation amount as negative electrode SEI formation amount=A−Z.

In the components of the above-mentioned measurement device 1, the charge/discharge controller 10, the storage 50, and the calculation part 60 are realized by executing a program (software) using a hardware processor such as a central processing unit (CPU) or the like. Some or all of these components may be realized by hardware (circuit part; including circuitry) such as large scale integration (LSI), an application specific integrated circuit (ASIC), a field-programmable gate array (FPGA), a graphics processing unit (GPU), or the like, or may be realized by cooperation of software and hardware. The program may be stored in a storage device (a storage device including a non-transient storage medium) such as a hard disk drive (HDD), a flash memory, or the like, in advance, may be stored in a detachable storage medium (non-transient storage medium) such as a DVD, a CD-ROM, or the like, or may be installed by mounting the storage medium in a drive device.

The above-mentioned measurement device 1 can be mounted on a moving body that travels using, for example, an electric motor. In such a moving body, the lithium ion battery BAT configured to supply electric power for driving the electric motor is also mounted. Then, the measurement device 1 mounted on the moving body can calculate a negative electrode SEI formation amount of the lithium ion battery BAT through, for example, self-monitoring, evaluate performance and deterioration of the lithium ion battery, and emit a warning such as repair, exchange, or the like. Further, the lithium ion battery BAT may be, for example, a battery pack such as a cassette type or the like, which is detachably mounted on the moving body.

Here, the moving body may be, for example, a battery electric vehicle (BEV: electric automobile) that travels using an electric motor driven by electric power supplied from the lithium ion battery BAT. Alternatively, the moving body may be a plug-in hybrid vehicle (PHV) or a plug-in hybrid electric vehicle (PHEV) having an external charging function on a hybrid vehicle. Further, the moving body may be, for example, not only a four-wheeled vehicle but also a saddle riding type two-wheeled vehicle, a vehicle such as a three-wheeled vehicle (including a two-front-wheeled and one-rear-wheeled vehicle in addition to one-front-wheeled and two-rear-wheeled vehicle), an assisted bicycle, an electric boat, or the like.

<Operation of Calculation Part>

Figure 2:
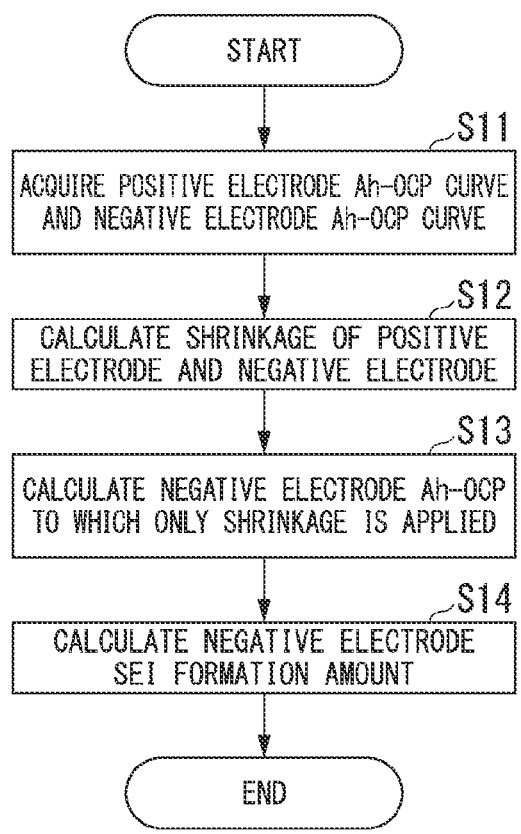
FIG. 2 is a flowchart for describing a measurement method according to an embodiment of the present invention.
Figure 3:
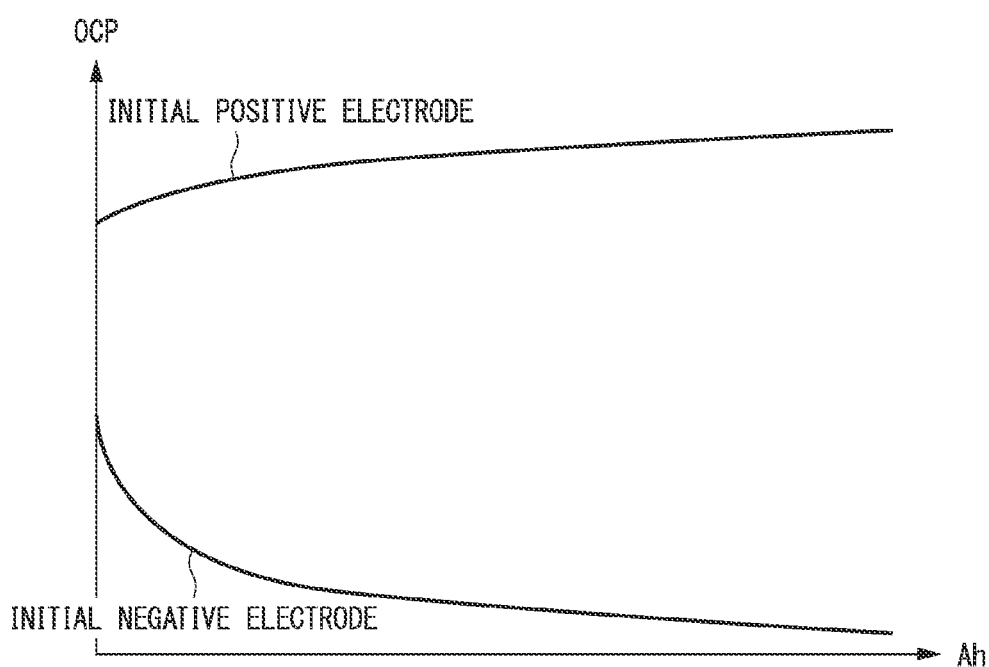
FIG. 3 shows Ah-OCP curves of a positive electrode and a negative electrode acquired by dV/dQ analysis and charge/discharge curve fitting in the measurement method according to the embodiment of the present invention.
Figure 4:
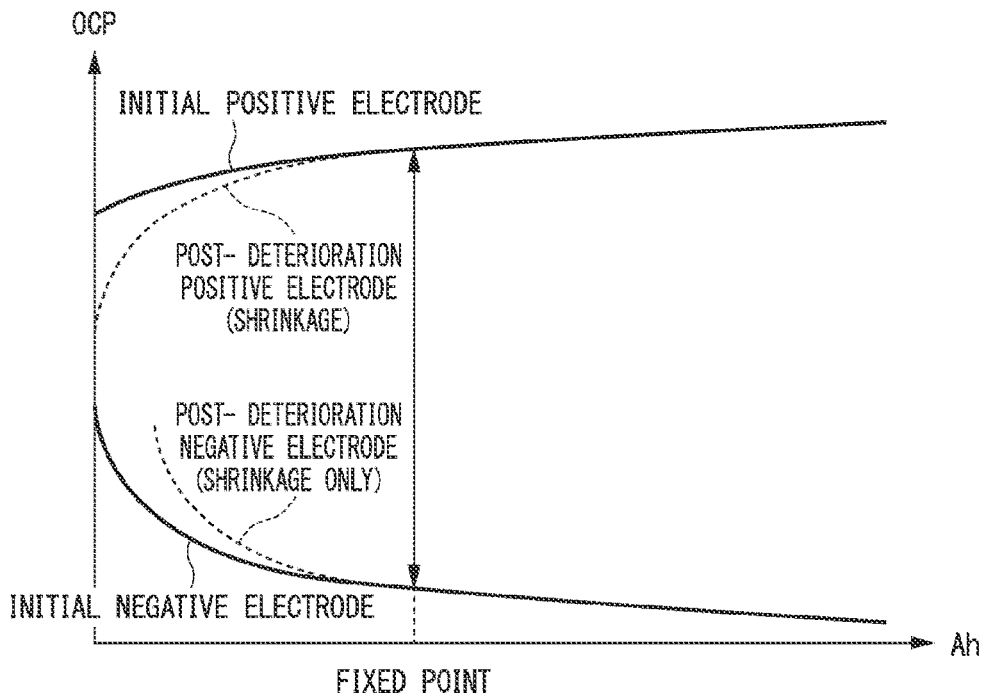
FIG. 4 shows Ah-OCP curves of the positive electrode and the negative electrode to which only a shrinkage factor is applied in which the Ah-OCP curves of the positive electrode and the negative electrode being calculated by multiplying the shrinkage factor with respect to the initial positive electrode Ah-OCP curve and the initial negative electrode Ah-OCP curve while having a fixed point (electric potential) derived from the Ah-OCP curves of the positive electrode and the negative electrode in FIG. 3 under a durability condition set as a reference in the measurement method according to the embodiment of the present invention.
Figure 5:
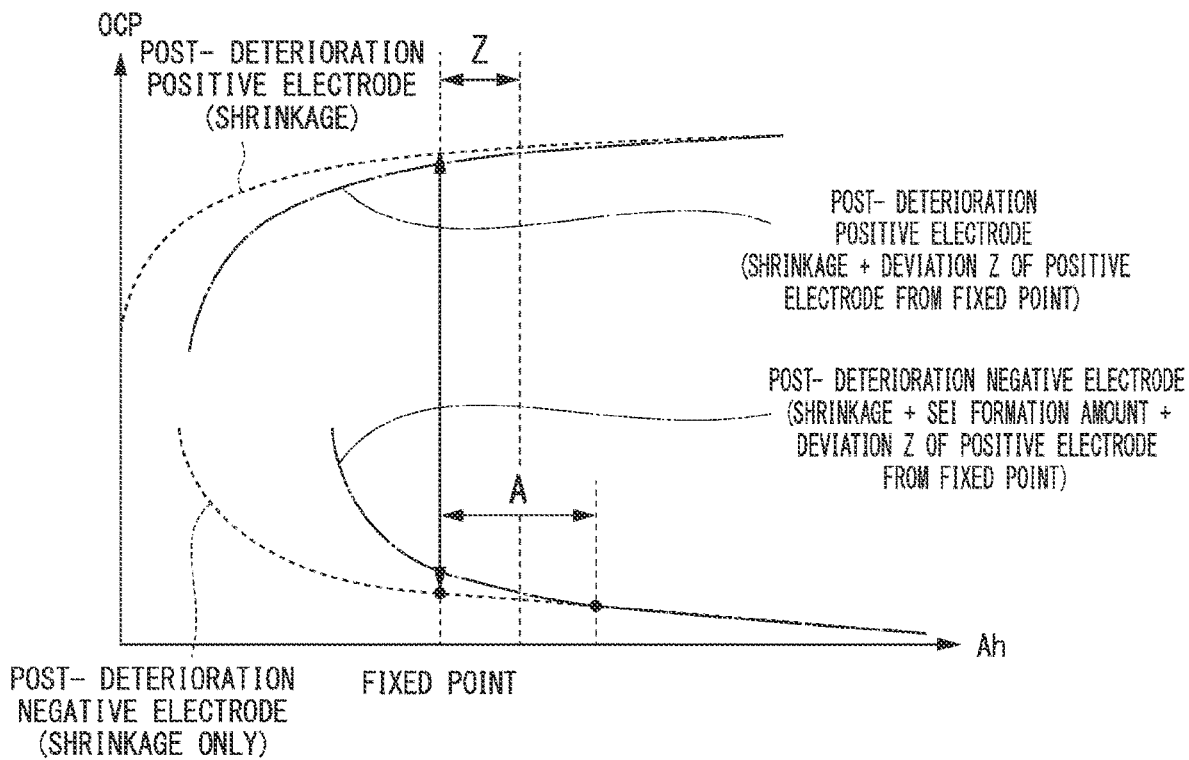
FIG. 5 shows Ah-OCP curves of the positive electrode and the post-deterioration negative electrode in the measurement method according to the embodiment of the present invention.

FIG. 2 is a flowchart showing an operation example of the calculation part 60 of the measurement device according to the embodiment of the present invention. FIG. 3 to FIG. 5 are Ah-OCP curves calculated by the calculation part 60.

(S11) A computer acquires an initial positive electrode Ah-OCP curve and an initial negative electrode Ah-OCP curve by using a dV/dQ curve and charge/discharge curve fitting on the basis of a result of a charge/discharge test of a lithium ion battery (FIG. 3).

(S12) Next, a shrinkage factor (%) from an initial value for each of the positive electrode and the negative electrode is calculated.

(S13) Next, the computer calculates a positive electrode Ah-OCP curve and a negative electrode Ah-OCP curve to which only the shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having the fixed point (electric potential) derived from the initial positive electrode Ah-OCP curve and the initial negative electrode Ah-OCP curve under a durability condition set as a reference (FIG. 4). The Ah-OCP curve does not receive influence of the shrinkage factor of the electrode only at the fixed point.

(S14) The computer calculates the deviation Z of the Ah between the fixed point of the positive electrode Ah-OCP curve to which only the shrinkage factor is applied and the fixed point of the post-deterioration positive electrode Ah-OCP curve calculated by the dV/dQ curve and the charge/discharge curve fitting (FIG. 5).

(S15) The computer calculates the deviation A of the Ah between the fixed point of the negative electrode Ah-OCP curve to which only the shrinkage factor is applied and the fixed point of the post-deterioration negative electrode Ah- OCP curve calculated by the dV/dQ curve and the charge/discharge curve fitting (FIG. 5).

(S16) The computer calculates the negative electrode SEI formation amount as A−Z (A minus Z).

The above-mentioned embodiment can be expressed as described below.

A measurement device configured to measure a negative electrode SEI formation amount of a lithium ion battery comprises:
- a storage medium (storage medium) configured to store a command that is readable by a computer; and
- a processor connected to the storage medium,
- the processor executes the command that is readable by the computer, and
- the computer is configured to acquire an initial positive electrode Ah-OCP curve and an initial negative electrode Ah-OCP curve by using a dV/dQ curve and charge/discharge curve fitting on the basis of a result of a charge/discharge test of a lithium ion battery, calculate a shrinkage factor (%) from an initial value for each of the positive electrode and the negative electrode, calculate a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference, calculate a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting, calculates a deviation A of Ah between the fixed point of the negative electrode Ah-OCP curve to which only the shrinkage factor is applied and the fixed point of the post-deterioration negative electrode Ah-OCP curve calculated by the dV/dQ curve and the charge/discharge curve fitting, and calculate a negative electrode SEI formation amount as A−Z (A minus Z).

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A measurement device configured to measure a negative electrode SEI formation amount of a lithium ion battery, comprising:
- a charge/discharge controller configured to perform charge/discharge control of the lithium ion battery;
- a voltage measurement part configured to measure a discharge voltage of the lithium ion battery;
- a current measurement part configured to measure a discharge current of the lithium ion battery;
- a discharge time measurement part configured to measure a discharge time of the lithium ion battery;
- a storage configured to store measurement results of the voltage measurement part, the current measurement part and the discharge time measurement part; and
- a calculation part configured to calculate a negative electrode SEI formation amount of the lithium ion battery, wherein the calculation part causes a computer to:
- acquire an initial positive electrode Ah-OCP curve and an initial negative electrode Ah-OCP curve by using a dV/dQ curve and charge/discharge curve fitting on the basis of results of the voltage measurement part, the current measurement part, and the discharge time measurement part that are read from the storage,
- calculate a shrinkage factor (%) from an initial value for each of the positive electrode and the negative electrode,
- calculate a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference,
- calculate a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting,
- calculate a deviation A of Ah between a fixed point of the negative electrode Ah-OCP curve to which only the shrinkage factor is applied and a fixed point of a post-deterioration negative electrode Ah-OCP curve calculated by a dV/dQ curve and charge/discharge curve fitting, and
- calculate a negative electrode SEI formation amount as A−Z (A minus Z).

2. A measurement method for measuring a negative electrode SEI formation amount of a lithium ion battery, comprising:
- acquiring an initial positive electrode Ah-OCP curve and an initial negative electrode Ah-OCP curve by using a dV/dQ curve and charge/discharge curve fitting on the basis of results of a charge/discharge test of the lithium ion battery,
- calculating a shrinkage factor (%) from an initial value for each of the positive electrode and the negative electrode,
- calculating a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference,
- calculating a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting, calculating a deviation A of Ah between a fixed point of the negative electrode Ah-OCP curve to which only the shrinkage factor is applied and a fixed point of a post-deterioration negative electrode Ah-OCP curve calculated by a dV/dQ curve and charge/discharge curve fitting, and calculating a negative electrode SEI formation amount as A−Z (A minus Z).

3. A computer-readable non-transient storage medium, on which a program for measuring a negative electrode SEI formation amount of a lithium ion battery is stored, the program comprising:

acquiring an initial positive electrode Ah-OCP curve and an initial negative electrode Ah-OCP curve by using a dV/dQ curve and charge/discharge curve fitting on the basis of results of a charge/discharge test of the lithium ion battery, calculating a shrinkage factor (%) from an initial value for each of the positive electrode and the negative electrode, calculating a positive electrode Ah-OCP curve and a negative electrode Ah-OCP curve to which only a shrinkage factor is applied in which the positive electrode Ah-OCP curve and the negative electrode Ah-OCP curve being calculated by multiplying the shrinkage factor (%) with respect to the initial positive electrode Ah-OCP curve and the initial negative electrode Ah-OCP curve while having a fixed point (electric potential) derived from the initial positive electrode Ah-OCP curve and the initial negative electrode Ah-OCP curve under a durability condition set as a reference, calculating a deviation Z of Ah between a fixed point of the positive electrode Ah-OCP curve to which only the shrinkage factor is applied and a fixed point of a post-deterioration positive electrode Ah-OCP curve calculated by a dV/dQ curve and charge/discharge curve fitting, calculating a deviation A of Ah between a fixed point of the negative electrode Ah-OCP curve to which only the shrinkage factor is applied and a fixed point of a post-deterioration negative electrode Ah-OCP curve calculated by a dV/dQ curve and charge/discharge curve fitting, and calculating a negative electrode SEI formation amount as A−Z (A minus Z).

\* \* \* \* \*